(12) United States Patent
Golov

(10) Patent No.: US 11,989,445 B2
(45) Date of Patent: May 21, 2024

(54) AUTOMATIC OPERATING MODE MANAGEMENT FOR MEMORY USING WORKLOAD PROFILE DATA

(71) Applicant: Micron Technology, Inc., Boise, ID (US)

(72) Inventor: Gil Golov, Backnang (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/320,111

(22) Filed: May 13, 2021

(65) Prior Publication Data
US 2022/0365710 A1 Nov. 17, 2022

(51) Int. Cl.
*G06F 3/06* (2006.01)
*G06F 11/30* (2006.01)

(52) U.S. Cl.
CPC .......... *G06F 3/0656* (2013.01); *G06F 3/0619* (2013.01); *G06F 3/0631* (2013.01); *G06F 3/0679* (2013.01); *G06F 11/3058* (2013.01); *G06F 11/3075* (2013.01)

(58) Field of Classification Search
CPC .... G06F 3/0656; G06F 3/0619; G06F 3/0631; G06F 3/0679; G06F 11/3058; G06F 11/3075
See application file for complete search history.

(56) References Cited

U.S. PATENT DOCUMENTS

| | | | |
|---|---|---|---|
| 2008/0033980 A1* | 2/2008 | Delapedraja | G06F 16/10 707/999.12 |
| 2008/0189452 A1* | 8/2008 | Merry | G11B 19/044 710/56 |
| 2011/0153540 A1* | 6/2011 | Beg | G06F 11/079 706/46 |
| 2012/0095719 A1* | 4/2012 | Araki | G06F 1/3275 711/E12.001 |
| 2016/0062326 A1* | 3/2016 | Bang | G06F 1/206 700/299 |
| 2017/0024297 A1* | 1/2017 | Sogabe | G06F 11/1441 |
| 2018/0373617 A1* | 12/2018 | Gaier | G06F 11/3452 |
| 2019/0104081 A1* | 4/2019 | Kairali | H04L 47/83 |
| 2022/0188208 A1* | 6/2022 | Gutierrez | G06F 9/30079 |

* cited by examiner

*Primary Examiner* — Eric T Loonan
(74) *Attorney, Agent, or Firm* — Greenberg Traurig

(57) ABSTRACT

The disclosed embodiments relate to logging activities of memory devices and adjusting the operation of a controller based on the activities. In one embodiment, a method comprises monitoring, by a memory device, die temperatures and data sizes of commands issued to the memory device; determining, by the memory device, a target size for a buffer based on the die temperatures and data sizes; and adjusting, by the memory device, a current size of the buffer to meet the target size.

19 Claims, 9 Drawing Sheets

| TIME | TYPE | DATA |
|---|---|---|
| 1 | TEMP | -30 |
| 2 | RECEIVE WRITE | 25 |
| 3 | RECEIVE WRITE | 50 |
| 4 | RECEIVE WRITE | 25 |
| 5 | RECEIVE WRITE | 50 |
| 6 | TEMP | -20 |
| 7 | RECEIVE WRITE | 100 |
| 8 | RECEIVE WRITE | 125 |
| 9 | RECEIVE WRITE | 50 |
| 10 | TEMP | -10 |
| 11 | RECEIVE WRITE | 500 |
| 12 | RECEIVE WRITE | 1,000 |
| 100 | TEMP | -40 |
| 101 | RECEIVE WRITE | 25 |
| 102 | RECEIVE WRITE | 50 |
| 103 | RECEIVE WRITE | 25 |
| 104 | TEMP | -30 |
| 105 | RECEIVE WRITE | 25 |
| 106 | RECEIVE WRITE | 100 |
| 107 | RECEIVE WRITE | 125 |

AUTOMATIC OPERATING MODE MANAGEMENT FOR MEMORY USING WORKLOAD PROFILE DATA

TECHNICAL FIELD

At least some embodiments disclosed herein relate to memory devices in general, and more particularly, but not limited to the adjustment of buffer sizes of memory devices based on logged event data.

BACKGROUND

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

The disclosed embodiments relate to logging activities of memory devices and adjusting the operation of a controller based on the activities. In one embodiment, a method comprises monitoring, by a memory device, die temperatures and data sizes of commands issued to the memory device; determining, by the memory device, a target size for a buffer based on the die temperatures and data sizes; and adjusting, by the memory device, a current size of the buffer to meet the target size.

Figure 1:
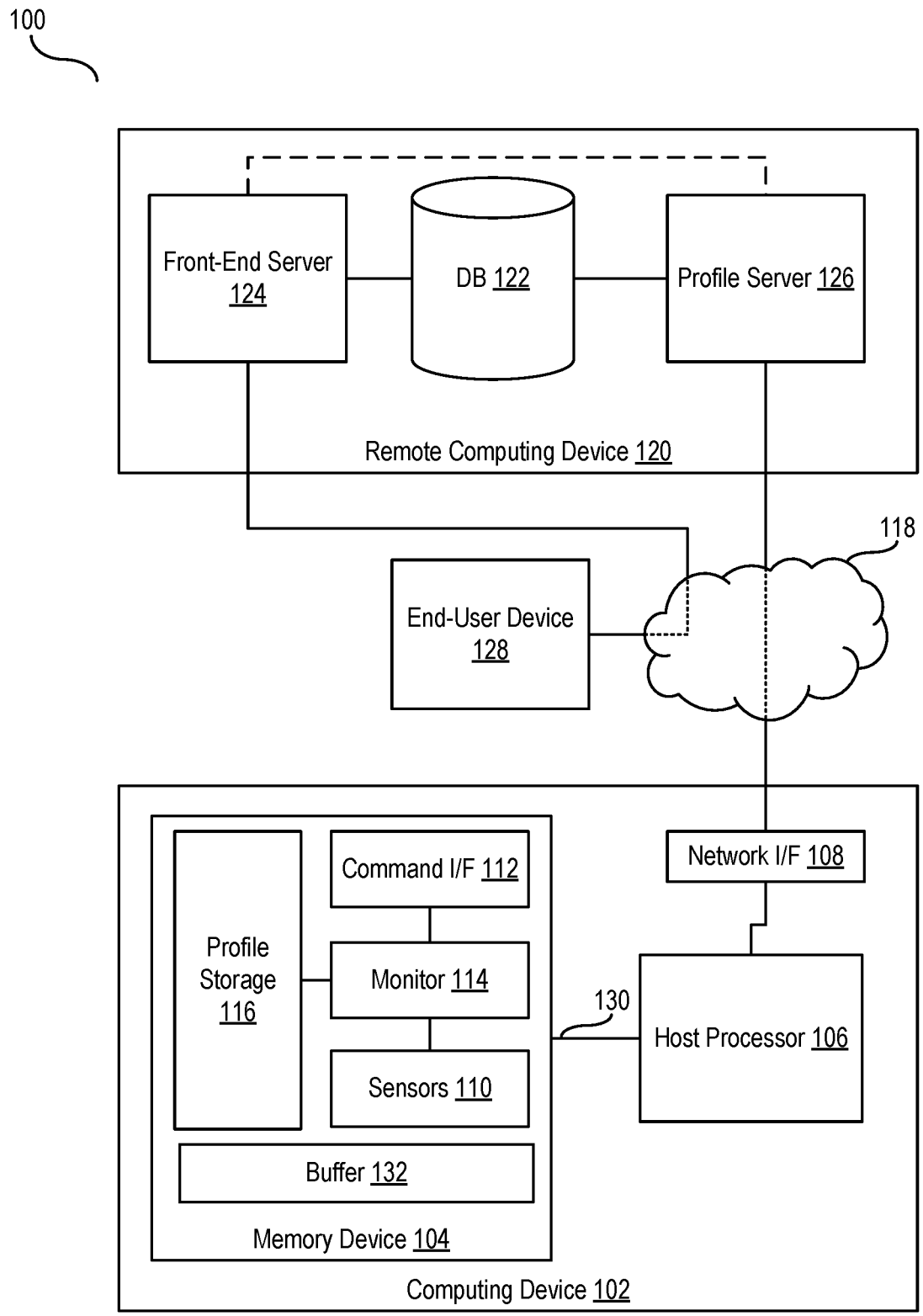
FIG. 1 is a block diagram of a system for managing the operations of a memory device based on monitored activities according to some embodiments of the disclosure.

FIG. 1 is a block diagram of a system for managing the operations of a memory device based on monitored activities according to some embodiments of the disclosure.

In the illustrated embodiment, a system (100) includes a local computing device (102), a remote computing device (120), and an end-user computing device (128). In the illustrated embodiment, these devices communicate over a network (118), such as the Internet or a local area network.

In the illustrated embodiment, the local computing device (102) may comprise a personal computer (e.g., a laptop or desktop), mobile computing device (e.g., a mobile phone, tablet, etc.), Internet-of-Things (IoT) device, computing device installed within a vehicle, or generally any computing device that requires non-volatile storage. The disclosure does not limit the types of computing systems that may implement the description of the local computing device (102).

As illustrated, the local computing device (102) includes a host processor (106) and a memory device (104). The host processor (106) may comprise a central processing unit (CPU), graphics processing unit (GPU), system-on-a-chip (SoC), application-specific integrated circuit (ASIC), field-programmable gate array (FPGA), or another type of device for performing computation based on data stored in the memory device (104). The host processor (106) may perform arbitrary computations and calculations based on programs and data stored in the memory device (104). The specific types of computation performed by the host processor (106) are not limiting.

In the illustrated embodiment, the host processor (106) is communicatively coupled to a memory device (104) via a bus (130). In one embodiment, the bus (130) may comprise a peripheral component interchange (PCI) bus, a PCI express (PCIe) bus, a non-volatile memory express (NVMe) bus, or generally any type of bus that can communicatively couple a storage device (e.g., memory 104) to a processor (e.g., host processor 106).

In the illustrated embodiment, the memory device (104) comprises a solid-state drive (SSD). In another embodiment, the memory device (104) may comprise a non-volatile memory (NVM). In some embodiments, the memory device (104) may comprise a NAND or NOR Flash memory device. In some embodiments, the memory device (104) may comprise an embedded MultiMediaCard (eMMC) memory device. In general, any device capable of persistently storing data may be used as a memory device (104). In an alternative embodiment, the memory device (104) may comprise a volatile memory device such as a dynamic random-access memory (DRAM) or static random-access memory (SRAM) device.

The memory device (104) includes a storage array (not illustrated) for storing data such as programs and program data. In the illustrated embodiment, a portion of the storage array is used as profile storage (116). As used herein, a profile refers to recorded data associated with the memory device. A profile may store data such as the commands received from the host processor (106), timestamps when the commands are received, and timestamps when the commands are executed. Alternatively, or in conjunction with the foregoing, the profile may store data representing the results of commands such as the number of read failures or write failures or the number of internal operations performed by the memory device (104). Alternatively, or in conjunction with the foregoing, the profile data may record extrinsic properties of the memory device (104) such as the die temperature of the memory device, an external, ambient temperature, shock or vibration indicators, etc. In some embodiments, the profile storage (116) is implemented in an unused portion of the underlying storage array. Thus, in some embodiments, the profile storage (116) may be relocated based on available disk space. In some embodiments, the profile storage (116) is persistent across power cycles. In other embodiments, the memory device (104) may transfer the profile to another device prior to powering down. Alternatively, or in conjunction with the foregoing, the memory device (104) may transfer the profile periodically, as will be discussed.

In the illustrated embodiment, the memory device (104) includes a command interface (112) to receive commands from the host processor (106). These commands may comprise read, write, erase, or similar commands to manipulate data stored by the memory device (104). As illustrated, the command interface (112) may be implemented in a controller or microprocessor onboard the memory device (104) and may appropriately access the storage array to operate the memory device (104).

In the illustrated embodiment, the memory device (104) further includes a buffer (132). In one embodiment, the buffer (132) may comprise a portion of the storage array However, in most embodiments, the buffer (132) comprises a portion (or entire) volatile storage device such as DRAM and act as a local cache (808). In some embodiments, the underlying volatile storage device may be shared and used for other functions such as LBA-PBA mapping or administrative uses. The volatile storage may further be used for storing instructions (e.g., microcode) to execute commands by the command interface (112). In some embodiments, the size of buffer (132) is constrained by both the total available volatile storage capacity as well as a configurable limit. For example, a controller (806) may be configured to adjust the size of the buffer (132) to accommodate more or less data. As will be discussed, in the illustrated embodiment, the controller (806) may perform this adjustment based on logged data such as that logged in FIG. 2A.

In the illustrated embodiment, the memory device (104) further includes sensors (110). In the illustrated embodiment, sensors (110) may comprise temperature sensors, accelerometers, gyroscopes, magnetometers, and any other type of sensor that measures a real-world metric related to the memory device (104). In some embodiments, the sensors (110) may be external to the memory device (104). In this embodiment, the memory device (104) will receive the sensor data over the bus (130).

The memory device (104) includes a monitor (114) that is communicatively coupled to both the command interface (112) and the sensors (110). In the illustrated embodiment, the monitor (114) passively intercepts commands sent through the command interface (112). Further, the monitor (114) may passively or actively receive sensor data from sensors (110).

Figure 8:
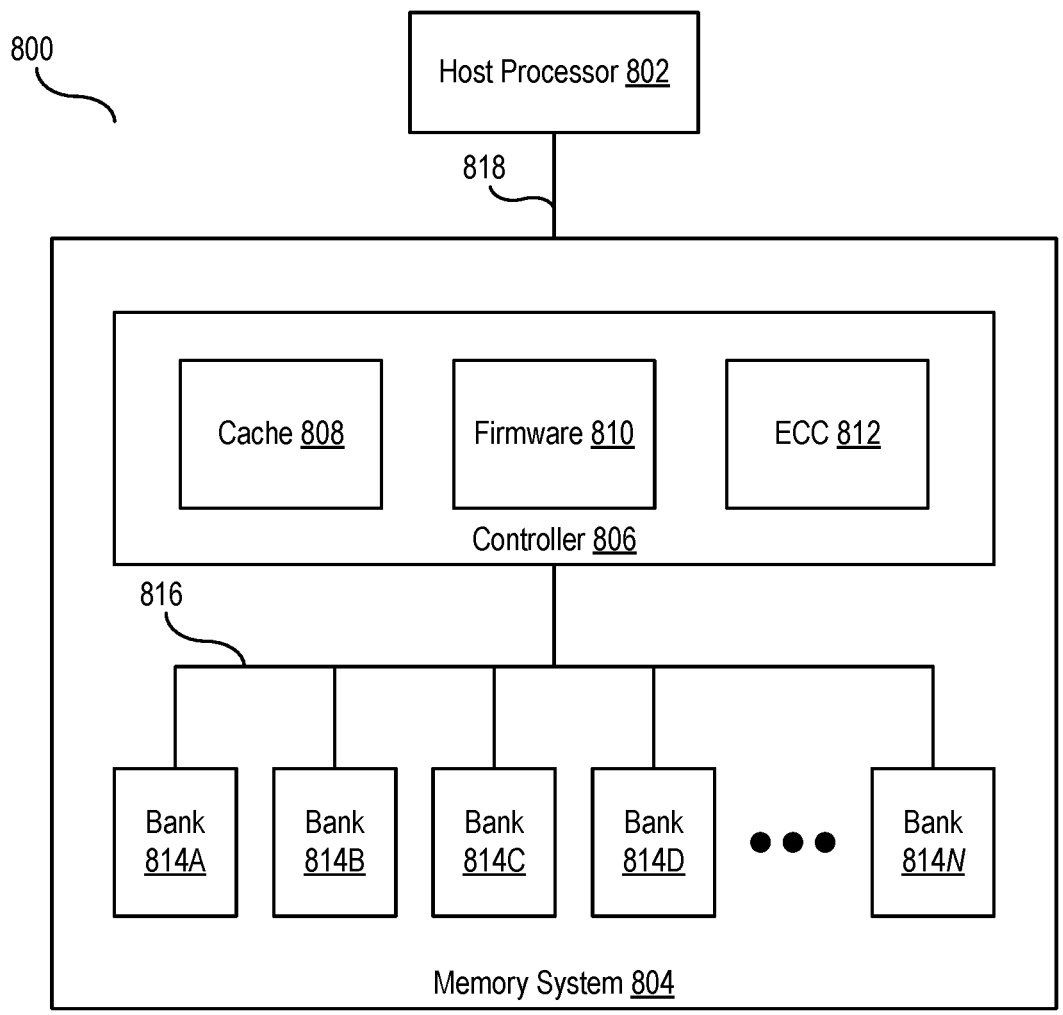
FIG. 8 is a block diagram illustrating a memory system according to some embodiments of the disclosure.

In one embodiment, commands issued to the command interface (112) are also received by the monitor (114). Examples of such commands are read commands and write commands that access a storage array of the memory device (104). In one embodiment, the monitor (114) timestamps all commands and writes the commands to a command log in profile storage (116). Alternatively, or in conjunction with the foregoing, the monitor (114) may additionally receive notifications or other signals from the command interface (112) or from a controller (as depicted in FIG. 8), indicating when a given command is being executed. In this embodiment, the monitor (114) may timestamp the previously written command with an execution time. In other embodiments, the monitor (114) may alternatively update a separate command execution log with the execution timestamp. In both scenarios, the monitor (114) may associate each command with a received timestamp and an execution timestamp.

Figures 2A, 2B:
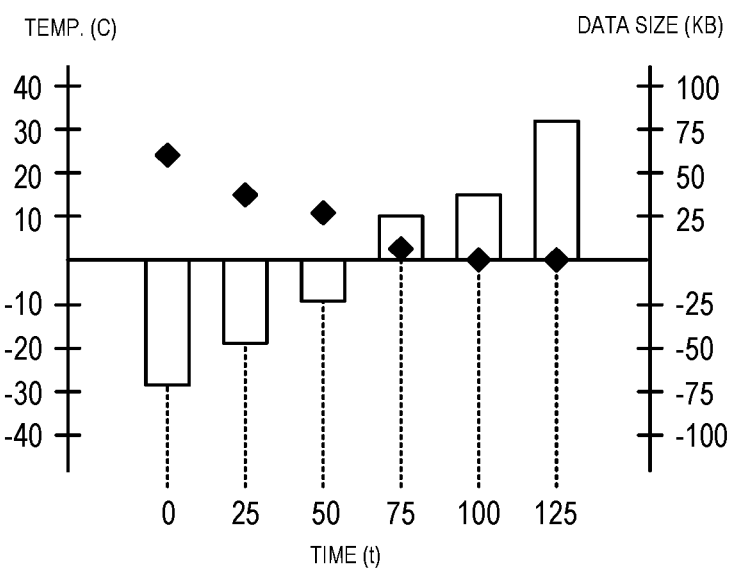
FIG. 2A is an exemplary log file according to some embodiments of the disclosure.
FIG. 2B is a graph of an exemplary data point recorded by a set of memory devices according to some embodiments of the disclosure.

FIG. 2A is an exemplary log file according to some embodiments of the disclosure. In the illustrated embodiment, each entry includes a timestamp, and two sections of entries are depicted (between times 0-12 and 100-107). The use of integer timestamps is for explanatory purposes only, and other formats (e.g., UNIX epoch) may be used. In the illustrated embodiment, a single log file is utilized, and thus a "type" field is used to distinguish among events and commands. In the illustrated embodiment, various temperatures (TEMP) and write commands (RECEIVE WRITE) are logged and timestamped. For example, at t=1, a temperature of −30° C. is recorded while at t=2 a data size of 25 kB is recorded. Other data may be recorded in addition to write and temperature data as described herein and also in commonly owned U.S. patent application Ser. No. 17/320,109.

Iteratively, or in conjunction with the foregoing, the monitor (114) may record any errors, faults, or other anomalous data that is generated by the memory device (104). In these embodiments, the monitor (114) may write these errors and similar data in a separate portion of the profile storage (116). In some embodiments, if the errors or similar data are associated with previously written commands, the monitor (114) may update the logged command with data describing the error or other fault-like conditions.

Alternatively, or in conjunction with the foregoing, the monitor (114) may retrieve data from sensors (110). In some embodiments, the monitor (114) may retrieve sensor measurements (e.g., temperature) from sensors (110) according to preconfigured intervals. Alternatively, or in conjunction with the foregoing, the monitor (114) may be configured to adjust a sample rate of the sensors (110) based on other detected events. For example, upon detecting an error reading or writing to the memory device (104), the monitor (114) may increase a sample rate of, for example, temperature data to provide finer-grained detail of a correlation between errors and temperature data. While temperature is used as an example, the same or similar techniques may be applied to other types of sensors such as gyroscopes and accelerometers.

In some embodiments, the monitor (114) may also be configured to log system-level events. In these embodiments, the monitor (114) may receive (or monitor for) these events generated by a controller of the memory device (104). For example, the monitor (114) may receive events indicating when the memory device is powered on or about to be powered off. In some embodiments, the monitor (114) may synthesize these events itself when it powers on or off.

In some embodiments, the monitor (114) may periodically inspect the profile storage (116) and transmit the data of the profile storage (116) to a remote computing device (120). In one embodiment, the monitor (114) may be configured to write the aforementioned log data to an unused portion of the storage array of a memory device (104). In some embodiments, the monitor (114) manages the size of the profile storage (116) to ensure that the storage capacity of the profile storage (116) is not exceeded. For example, a controller of the memory device (104) may allocate a fixed portion of the storage array (e.g., 128 MB) for profile storage. The controller would then prevent writing to that portion of the storage array by managing its addressing scheme and preventing external writes to the physical addresses of the profile storage (116). In one embodiment, either the controller or the monitor (114) may monitor how much space the profile storage (116) is occupying and, when the capacity approaches full utilization, initiates a network transfer operation (described herein). Alternatively, or in conjunction with the foregoing, the controller or monitor (114) may be configured to relocate or resize the profile storage (116). For example, in some embodiments, the monitor (114) may determine that the profile storage requires additional capacity and a network transfer operation is not possible (e.g., due to the lack of a reliable network connection). In this scenario, the monitor (114) can request that the controller update its address table (e.g., logical block address table) to free additional space for the profile storage (116). In some embodiments, this may require the moving of existing data to other areas of the storage array.

As discussed above, the monitor (114) may periodically initiate a network transfer operation wherein the contents of the profile storage (116) are uploaded to the remote computing device (120). In some embodiments, the memory device (104) issues network requests using the host processor (106) and network interface (108) as an intermediary. In other embodiments, the memory device (104) may include its own network interface to communicate directly over a network. In either scenario, the memory device (104) establishes a network connection with the remote computing device (120) over a network (118). In one embodiment, the network (118) may comprise a public network such as the Internet or a private network. In some embodiments, all connections between the memory device (104) and the remote computing device (120) are encrypted (e.g., via Transport Layer Security, TLS).

In some embodiments, after establishing a connection (e.g., a transmission control protocol, TCP, session), the memory device (104) uploads the contents of the profile storage (116) to the remote computing device (120). In one embodiment, the memory device (104) includes a unique and secret identifier of the memory device (104) in the communications. In this manner, the data in the profile storage (116) can be uniquely associated with the memory device (104). In some embodiments, the remote computing device (120) is operated by a manufacturer of the memory device (104). In this scenario, only the manufacturer and the memory device store the unique identifier, and thus the remote computing device (120) can safely presume that the reported profile storage (116) data are appropriately associated with the memory device (104). In other embodiments, the memory device (104) may sign the communications with a private key, and thus the remote computing device (120) can verify the communications with the corresponding public key.

In the illustrated embodiment, the incoming profile storage (116) data is received by a front-end profile server (126). The profile server (126) may comprise a lightweight application server that exposes one or more functions callable over a network (118). In the illustrated embodiment, the profile server (126) receives profile data from the memory device (104). The profile server (126) may verify the identity of the memory device (104) as described above. After identifying the memory device (104), the profile server (126) may preprocess the profile data. For example, the profile server (126) may deduplicate profile data, normalize the profile data to a preconfigured schema, augment the profile data based on the identity of the memory device (104) (i.e., add a unique identifier of the memory device 104 to each record), and various other "cleaning" operations.

After preprocessing the data, the profile server (126) writes the data to a database (122). In one embodiment, the database (122) can comprise any commercially available database. In some embodiments, the database (122) comprises a relational database such as MySQL, Postgresql, or similar databases. In other embodiments, the database (122) may comprise a document-oriented database (e.g., MongoDB, CouchDB, etc.). In some embodiments, the database (122) may comprise a log-oriented storage data structure. In some embodiments, the database (122) may comprise a cluster of databases. In some embodiments, this cluster may comprise a single type of database, while in other embodiments, the cluster may have different types of databases.

In the illustrated embodiment, the database (122) acts as a central repository for profile data. In the illustrated embodiment, a front-end server (124) is communicatively coupled to the front-end server (124). In one embodiment, the front-end server (124) accesses the data stored in the database (122) in response to requests from end-user devices such as the end-user device (128). After accessing the data in the database (122), the front-end server (124) packages the data and returns a response to the end-user device (128).

In the illustrated embodiment, the front-end server (124) is configured to provide a dashboard or portal for owners of memory devices. For example, the end-user device (128) may comprise a laptop, desktop, or mobile device operated by a customer employee. The customer may have purchased and deployed various memory devices (including memory device 104) and additionally has an account with the remote computing device (120) that is also associated with the memory devices. Thus, the end-user device (128) can log into the front-end server (124) via a website or mobile application and load a dashboard that displays details of all memory devices associated with the end-user. For example, the front-end server (124) can retrieve all data related to a set of memory devices associated with the end-user and display a graph depicting the temperatures reported over time. The front-end server (124) may also augment the graph with indicators of reading failures, thus correlating temperatures to read/write failures in a graphical fashion. No limitation is placed on the type of visualizations generated by the front-end server (124) using the data in the database (122).

In one embodiment, the front-end server (124) may also support receiving user input from the end-user device (128) and adjusting settings of the memory device (104) based on this input. As illustrated, in some embodiments, an optional feedback loop is provided between the front-end server (124) and the profile server (126). In this embodiment, the front-end server (124) can relay instructions to the profile server that affect the processing of a memory device (104). The profile server (126) can then parse and transmit commands to the memory device (104) to adjust the internal operations of the memory device (104). As discussed, each transmission may be signed using cryptographic keys to ensure the integrity of the system. The following example further describes this feedback.

As an example, the end-user device (128) may access the dashboard provided by the front-end server (124) and load a graph illustrating average temperatures of memory devices and read/write errors after starting up. FIG. 2B provides an example of such a graph. In the illustrated graph of FIG. 2B, the memory devices may be installed in automobiles and thus frequently started at colder temperatures. In the illustrated embodiment, the graph illustrates the average temperatures of a fleet of memory devices at startup (t=0) to 125 seconds (t=125). As illustrated, the temperature of the memory devices generally is approximately −30° C. and increases to approximately 30° C. in 125 seconds. Further, as illustrated, at startup (t=0), the memory devices average roughly 60 kilobytes of data. The volume of data gradually decreases until t=100, where the volume of data is close to or equal to zero. In some embodiments, the graph can be for a single device or, as discussed, can average data across a fleet of devices (that may, themselves, be selectable by the end-user device (128)).

In the illustrated embodiment, the operator of the end-user device (128) may determine that buffer size should be initialize increased and then reduced as much as possible as the temperature rises. Given the averaged data, the operator may determine that a memory device should initially allocate an additional 100 kb of buffer space when the temperature is −30° C. and slowly reduce the additional buffer space until the temperature reaches 0° C. Thus, the end-user device (128) may issue this request to the front-end server (124). The front-end server (124), in turn, may forward the request to the profile server (126). The profile server (126) may identify all affected memory devices (e.g., based on the identifiers of memory devices used to generate the graph) and issue a request to each memory device (e.g., 104) to update the firmware of the memory devices to buffer commands for 75 seconds after startup. As discussed above, and in further Figures, the memory device (104) may include firmware for handling certain events and commands. The profile server (126) may transmit updated firmware, or flags, that cause the memory device (104) to alter its internal operations.

Although the foregoing example uses the example of a user manually adjusting the settings of a memory device, in other embodiments, the adjustment may be performed automatically or optimistically. In some embodiments, a target may be set, and the remote computing device (120) may automatically adjust the operation of the memory device (104) based on these targets. For example, the remote computing device (120) may continuously monitor the data depicted in FIG. 2B and automatically issue the command to adjust a buffer size. In other embodiments, the remote computing device (120) may train machine learning models to predict future targets. For example, as a memory device ages, it generally is more sensitive to temperature changes. The remote computing device (120) may build models using the age of the memory devices, the temperature data, and the data size to determine how to adjust the buffer size during cold temperatures. The remote computing device (120) can then periodically run these models to determine whether to proactively adjust the properties of a memory device.

In the above embodiments, memory devices can self-report metrics to a central server. The central server can visualize the data for customers of the same memory devices, and the customers can remotely adjust the internal operation of memory devices without manually servicing or updating each device, thus allowing for fine-tuning of operations of memory devices in place. The following figures provide further detail of the operations of the system.

Figure 3:
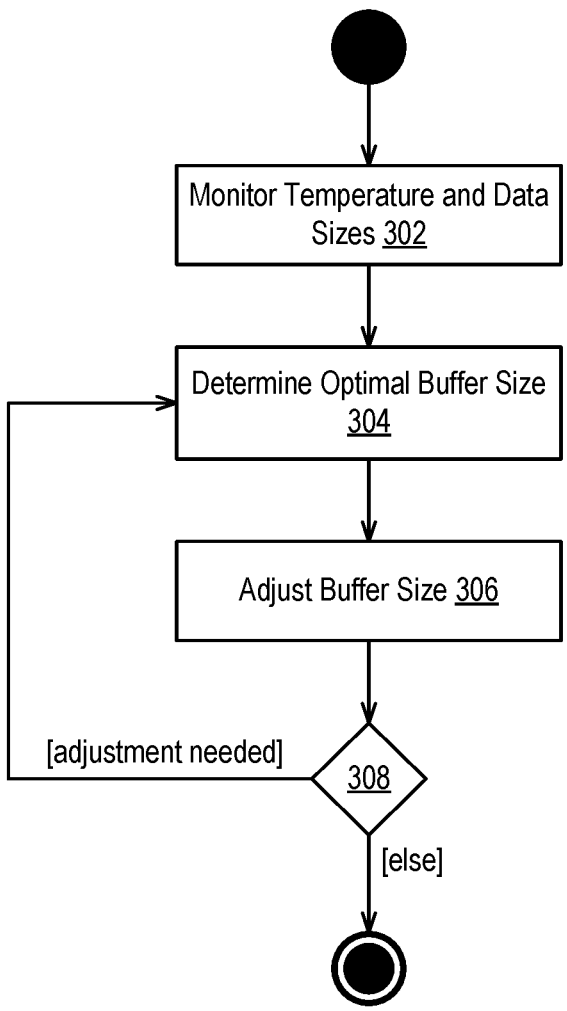
FIG. 3 is a flow diagram illustrating method for adjusting a buffer size of a memory device based on historical operating data according to some embodiments of the disclosure.

FIG. 3 is a flow diagram illustrating method for adjusting a buffer size of a memory device based on historical operating data according to some embodiments of the disclosure.

FIG. 3 is a flow diagram illustrating a method for adjusting a buffer size of a memory device based on historical operating data according to some embodiments of the disclosure.

In block 302, the method monitors the temperature of a memory device and the data sizes of commands received by the memory device.

As discussed, in some embodiments, a memory device includes a temperature sensor that records the die temperature of the memory device. In some embodiments, this sensor may continuously record the die temperature. In some embodiments, the sensor may periodically report a die temperature to a controller of the memory device. Alternatively, or in conjunction with the foregoing, the controller of the memory device may request a current die temperature from the temperature sensor as needed. In the illustrated embodiment, the method may continuously log temperatures at a given granularity (e.g., every second) as discussed. In the illustrated embodiment, the method may timestamp each temperature written to the log.

In parallel, the method may receive commands accessing the storage array of a memory device. Examples of commands include read and write commands. In some embodiments, each command is associated with the size of the underlying data required by the command (referred to as a "data size"). In one embodiment, a data size refers to the number of memory cells, addresses, or other units (referred to as "locations") used to store the data required by a command. In this embodiment, the method may calculate the underlying data's size by multiplying the number of locations by fixed-width data size. For example, a write command may access eight locations and each location may be configured to store two bytes. In this scenario, the data size could be abbreviated as eight or can be computed as sixteen bytes.

Alternatively, or in conjunction with the foregoing, the data size may only be computed as the total size of data read or written. In this embodiment, for read commands, the data size can be computed similarly by multiplying the number of addresses read by the width of the locations. In some embodiments, the method may only compute a data size based on data successfully returned in response to a read operation. Thus, in this embodiment, the method may account for read failures. For a write command, the method may compute the data size by analyzing the length of the data to write prior to writing. Alternatively, the method may compute the data size of the amount of data successfully written.

In some embodiments, the data size for a read command may comprise the number of addresses to read in response to a command or may comprise the total size of the data returned in response to the read command. Similarly, for a write command, the data size may comprise the number of addresses to write to or may comprise the total size of the data written by the write command. In some embodiments, for a write command, the data size may be extracted from the command itself since the data to write is included in the command. Thus, in some embodiments, the data size can be computed prior to executing the command.

In the illustrated embodiment, the method may continuously log data sizes for each command. As with temperature data, the data sizes may be timestamped with the current time. In some embodiments, the current time may comprise either the time the commands are received, the time the commands are executed, or the time the commands finish executing. In some embodiments, the method may log a timestamp for each of the foregoing times.

In block 304, the method determines an optimal, or target, buffer size for the memory device based on the logged temperatures and data size data.

In some embodiments, the method may implement an optional initial check to determine whether the current temperature (as read from the temperature sensor) is above or below a target operating temperature. For many memory devices, and especially triple-level cell (TLC) memory devices, writing to the storage array in very cold temperatures results in significant numbers of errors. To prevent the negative effects of these errors, a larger buffer can be used to buffer writes (or reads) until the current temperature is above the target operating temperature. For example, in an automotive scenario, the initial time after startup is often the most extreme cold a memory device will experience a greater number of errors during the initial startup period. Once the temperature of the vehicle increases, the memory device experiences normal operations. Thus, in an optional embodiment, the method may only execute block 304 (and subsequent blocks) when the current temperature is below the target operating temperature.

However, in some embodiments, the method may always execute block 304 (and subsequent blocks). In these embodiments, the method can continuous adjust the size of a buffer in response to fluctuations in temperatures (as well as account for corner cases of temperature variations).

In one embodiment, the method determines an optimal buffer size based on the historical temperature and data size log. In one embodiment, the method uses the current temperature to find all similarly logged temperatures. In one embodiment, the method may only identify a similar temperature if the historical temperature value matches the current temperature value. In other embodiments, the method may identify temperatures within a preset deviation from the current temperature. For example, if the deviation is three degrees and the current temperature is 0° C., the method will find all historical logged temperatures between −3° C. and 3° C.

As discussed above, each historical temperature is associated with a timestamp. Thus, in the illustrated embodiment, after identifying similar historical temperatures, the method next builds a time range in which to search for recorded data sizes. In one embodiment, the method utilizes a preset window size to identify the time ranges. For example, given a timestamp of 1614287788003 (in UNIX epoch time), the method may define a window of ±1000 (one second) to search for recorded data sizes. Thus, any data sizes timestamped between 1614287787003 and 1614287780003 will fall within the window.

For example, in FIG. 2A, a deviation of ±2 may be used and thus the writes at t=2, 3 are associated with the temperature at t=1, the writes at t=4, 5, 7, 8 are associated with the temperature reading at t=6.

In some embodiments, the method may first combine overlapping windows. Thus, if two windows overlap, the method will combine the windows into a single window. For example, a window [1614287788003, 1614287789003] and [1614287789000, 1614287710003] may be combined into one window [1614287788003, 1614287710003]. Certainly, the combining may be applied to an arbitrary number of windows.

Continuing the previous example in connection with FIG. 2A, the windows centered around t=6, t=10 include an overlapping data size point at t=8. Thus, these windows may be combined to include t=[4, 12]. Notably, in some embodiments, the method accounts for larger gaps in time and thus the temperature measurements at t=10, t=100 do not overlap. In some embodiments, when temperature windows are combined, the resulting temperature will be the average of all recorded temperatures $$\left(\text{e.g., } \frac{-10-20}{2} = -15\right).$$

After the conclusion of the foregoing steps, the method obtains a set of time windows having the same or similar temperatures to the current temperature. Next, the method queries the log to extract all data sizes logged in the time windows. From these data sizes, the method computes the optimal buffer size. Specifically, the log records the amount of data written at certain temperatures and thus, over time, can be analyzed to determine how much data on average is received at certain temperatures.

In one embodiment, the method calculates the average of all the responsive data sizes to obtain an average data size. This average data size is then used as the optimal buffer size. In another embodiment, the method may preweight the data sizes based on their distance from the middle of a responsive window. In this optional embodiment, the method presumes that recorded data sizes closer to the current temperature (the middle of a window) are more relevant than data sizes closer to the edges of the window. Thus, the method will more heavily weigh such centered data sizes.

Returning to FIG. 2A, the average data size when the temperature is −30° C. is calculated based on the corresponding data sizes of 25, 50, 50, 25, 25, 100 at t=2, 3, 102, 103, 105, 106 (assuming a deviation of ±2 defining the window). Thus, the optimal buffer size may be computed as the average of these measurements (approximately 46 kB). In some embodiments, however, the method may alternatively find the maximum value and use this value as the optimal buffer size (e.g., 100 kB). This scenario may be employed to prevent errors at all costs, despite the potential for wasted buffer space.

As discussed above, the illustrated method may be implemented in an automobile. Thus, the temperature data closely mirrors temporal data regarding vehicle startup. Specifically, the coldest temperatures most frequently occur during vehicle startup. Thus, the method implicitly models buffer size relative to vehicle start in some embodiments.

In some embodiments, block 304 may be performed entirely local to the memory device. In other embodiments, however, the method may receive the optimal buffer size from a remote computing device (120). In these embodiments, the memory device uploads its temperature and data size data to the remote computing device (120). The remote computing device (120) can then determine the optimal buffer size for one or more temperatures. For example, the remote computing device (120) can continuously analyze the data and recalculate the optimal buffer size for a range of temperatures. Alternatively, or in conjunction with the foregoing, a user can manually update the optimal buffer sizes based on viewing historical data, as described. In either embodiment, the remote computing device (120) may push the optimal buffer sizes to the memory device. In response, the memory device may adjust its firmware or microcode to manage the buffer size, as described below in block 306.

In block 306, the method adjusts the buffer size of the memory device using the optimal buffer size.

In one embodiment, the buffer size comprises a portion of SRAM or DRAM allocated for buffering data associated with commands. In one embodiment, the method maintains the size of the buffer during operations, and in block 306 increases or decreases this size based on the optimal buffer size. In some embodiments, the buffer comprises a page buffer. In one embodiment, the adjustment of the buffer size comprises an update to the operation of the controller in managing the buffer. In some embodiments, as part of this update, the controller may move data in the underlying storage device (e.g., SRAM or DRAM) to make room for the increased buffer size. In some embodiments, the method may transfer contents of the underlying storage device to persistent storage (e.g., NAND Flash) to make room for the buffer. In some embodiments, the method may cap the optimal buffer space based on the size of the underlying storage device or based on other internal maximums.

In block 308, the method determines if the optimal buffer size needs to be predetermined.

In one embodiment, block 308 may be triggered based on temperature changes. For example, if the current temperature changes by a preset threshold, the method may trigger an update to the optimal buffer size by re-executing blocks 304 and 306. Notably, the method may continue to operate block 302 continuously as a background process.

Alternatively, or in conjunction with the foregoing, the method may trigger block 308 in response to an external request from a remote computing device (120). In this embodiment, the method continuously executes block 302 until such a request is received and in response, may proceed to block 304. Notably, however, the request may already include the optimal buffer sizes (as discussed) and thus the method immediately proceeds to block 306 to apply the received buffer sizes.

Figure 4:
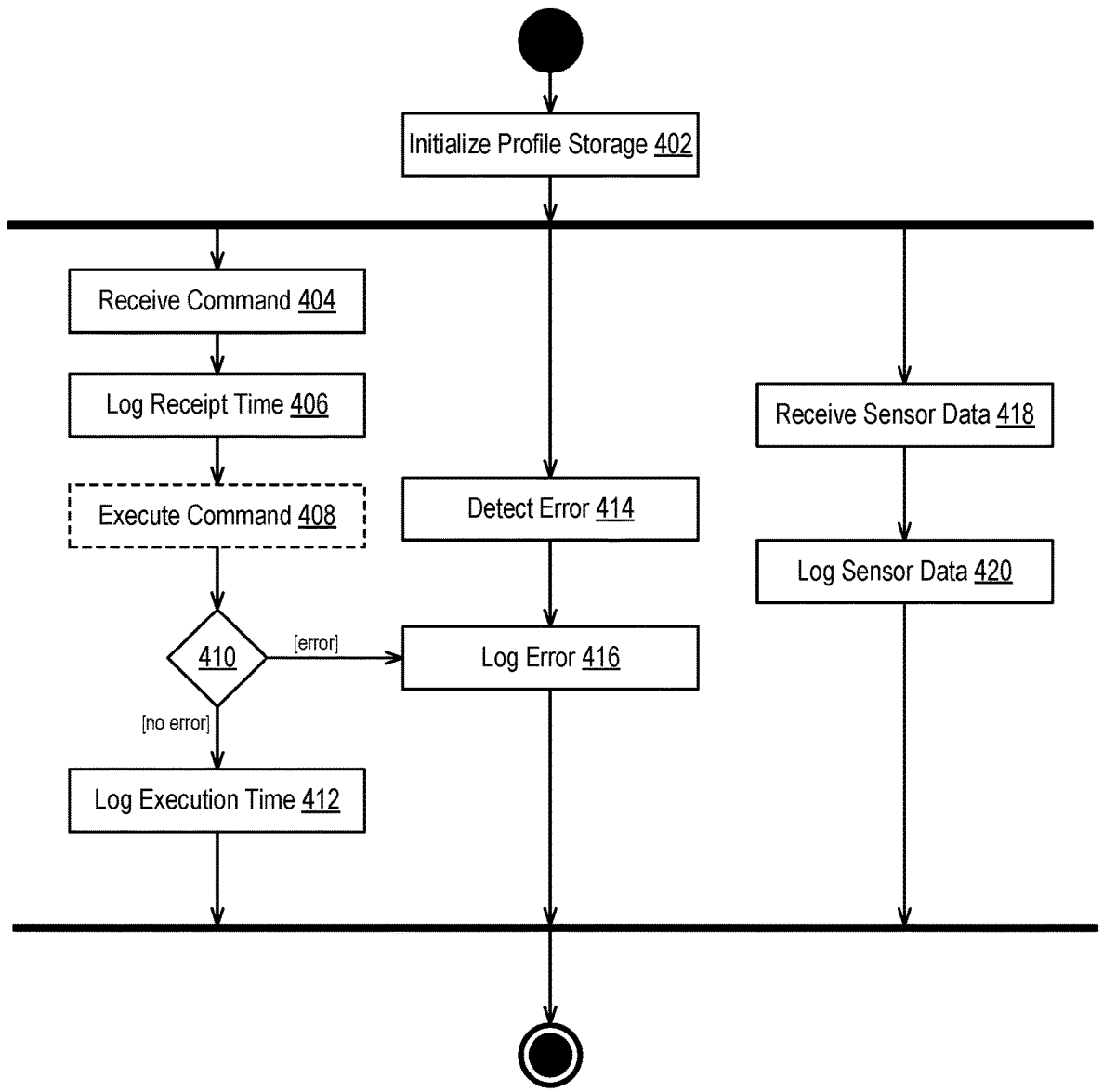
FIG. 4 is a flow diagram illustrating a method for generating and maintaining a profile of a memory device according to some embodiments of the disclosure.

FIG. 4 is a flow diagram illustrating a method for generating and maintaining a profile of a memory device according to some embodiments of the disclosure. In the illustrated embodiment, the method may be executed locally by a memory device and, in some embodiments, a controller of a memory device.

In block 402, the method initializes a profile storage location. In one embodiment, initializing a profile storage location comprises identifying a section of a memory array available for writing. In some embodiments, identifying a section of a memory array available for writing comprises identifying a preconfigured address space of the memory array. In other embodiments, identifying a section of a memory array available for writing comprises identifying an address space of the memory array that meets a pre-set size requirement. In one embodiment, the section of the memory array comprises a contiguous section of the memory array. In another embodiment, the section of the memory array comprises a non-contiguous section of the memory array. In one embodiment, if a non-contiguous section is utilized, the method may further comprise storing a mapping table of address locations corresponding to the profile storage location.

After block 402, the method may execute blocks 404, 414, and 418 (and their subsequent blocks) in parallel (e.g., in an interrupt-driven fashion). In general, blocks 404, 406, 408, 410, and 412 comprise a command logging subroutine; blocks 414 and 416 comprise an error logging subroutine, and blocks 418 and 420 comprise a sensor logging subroutine. Each is described in more detail herein.

In block 404, the method receives a command. In one embodiment, a command may comprise a read, write, erase, or similar command to manipulate data stored in the memory array. In one embodiment, the method receives commands over an interface such as a PCIe, NVMe interface, serial peripheral interface (SPI), or another type of interface. In the illustrated embodiment, the commands may include an identifier (e.g., an opcode), configuration flags, and data. In some embodiments, commands may only include an opcode, while other claims may include various configuration flags or data. In the illustrated embodiment, any command capable of being issued to a memory device falls within the scope of block 404.

In block 406, the method logs a receipt time. In one embodiment, the method retrieves a current time. In some embodiments, this time may comprise a system time accessible by the method and other computing devices. In other embodiments, it may comprise a locally recorded time generated by the memory device. In some embodiments, the memory device may receive an initial time and synchronize its own time with a clock source external to the memory device. In one embodiment, the receipt time is recorded immediately upon receiving a command. For example, the method may record the receipt time using a controller of the memory device. In one embodiment, the method then writes data to the memory array that includes the receipt time and details of the command. In one embodiment, the detail of the command may include the identifier (e.g., opcode) of the command, any configuration data, and any data in the command. In one embodiment, the method may not write the data but may write a summary the data. For example, the method may compute a checksum of the data or may compute the length of the data. In some embodiments, the method may write the memory addresses affected by the command.

In block 408, the method executes the received command. As illustrated, in some embodiments, block 408 may be optional or may be performed by existing controller logic. In brief, the controller may access microcode, firmware, or other instructions that implement the logic associated with the received command. The method may then execute that microcode to access the memory array and process the received command. As will be discussed in more detail, in some embodiments, this microcode may include parameters that affect the operation of the microcode. For example, a clock rate may be adjusted for executing the microcode. As discussed in more detail in connection with FIG. 7, these parameters may be adjustable by the memory device in response to commands from remote computing devices.

In block 410, the method determines if an error has occurred. In one embodiment, the microcode may generate an error during the execution of the program code associated with a command. For example, an error may be returned if the microcode cannot verify error correction codes associated with data. As another example, an error may be returned if the address associated with a command is not present in the address space of the memory device. As yet another example, the microcode may return an error if the command attempts to access a reserved address (e.g., the profile storage address space). In the illustrated embodiment, the method receives a notification of these errors, or may alternatively monitor an error bus, to determine when errors have occurred. In one embodiment, the controller associates errors with commands. In some embodiments, the method maintains a queue of pending commands received in block 404 and can associate errors with commands stored in the queue.

If an error has occurred, the method executes the error logging subroutine starting from block 416, which is described further herein and not repeated here. In brief, the method will log errors and associate the errors with a queued, pending command.

If no error occurs, the method logs the execution time of the command in block 412. In the illustrated embodiment, the controller may generate a completion signal once the microcode finishes executing a given command. This completion signal may be issued prior to the controller returning the result to the device that issued the command. In the illustrated embodiment, the method timestamps when the command completes and can associate the timestamp with a queued, pending command.

As illustrated, the method may include an error logging subroutine. This routine starts at block 414, where it detects an error. In some embodiments, errors are generated during the execution of microcode in response to commands. This entry point is discussed in connection with block 410 and is not repeated herein. Alternatively, some errors may be generated independently of external commands. For example, errors during the reading of a Flash translation table (i.e., LBA-PBA table) may be generated during startup. As another example, errors occurring during a garbage collection operation or other administrative operations may be generated and detected in block 414. In general, the error may include various details regarding the error used by the control for logging or recovery purposes.

In block 416, the method logs the error. In one embodiment, the method may associate the error with a command if the error was detected in block 410. Otherwise, the method may log the error without reference to a command.

As illustrated, the method may include a sensor logging subroutine. This routine starts at block 418, where it receives sensor data. Next, the method in block 420 logs the sensor data. In one embodiment, as described above, the method may periodically poll an external sensor for data and log the data to the profile storage. In one embodiment, the external sensor may comprise a temperature sensor or other sensor. In some embodiments, these requests are periodic. Alternatively, or in conjunction with the foregoing, the requests may be triggered by commands. Alternatively, or in conjunction with the foregoing, the requests may be triggered by errors. In these embodiments, the method may further include issuing a request to a sensor for data in response to detecting a command or error. For example, when an error occurs, the method may immediately request the temperature from an external sensor. Notably, in some embodiments, the sensors may be local to the memory device (e.g., an on-die temperature sensor), and thus the request can be completed without querying over an interface.

Although not illustrated, in some embodiments, the method of FIG. 4 may include an event logging subroutine. In this embodiment, the method logs arbitrary events reported by a controller of a memory device.

In some embodiments, the methods of FIG. 4 (and the remaining figures) may be configured to execute automatically on a memory device. In other embodiments, the methods may be executed in response to the activation by the user of the methods. For example, the memory device may include a configuration option that enables the methods described above and herein.

Figure 5:
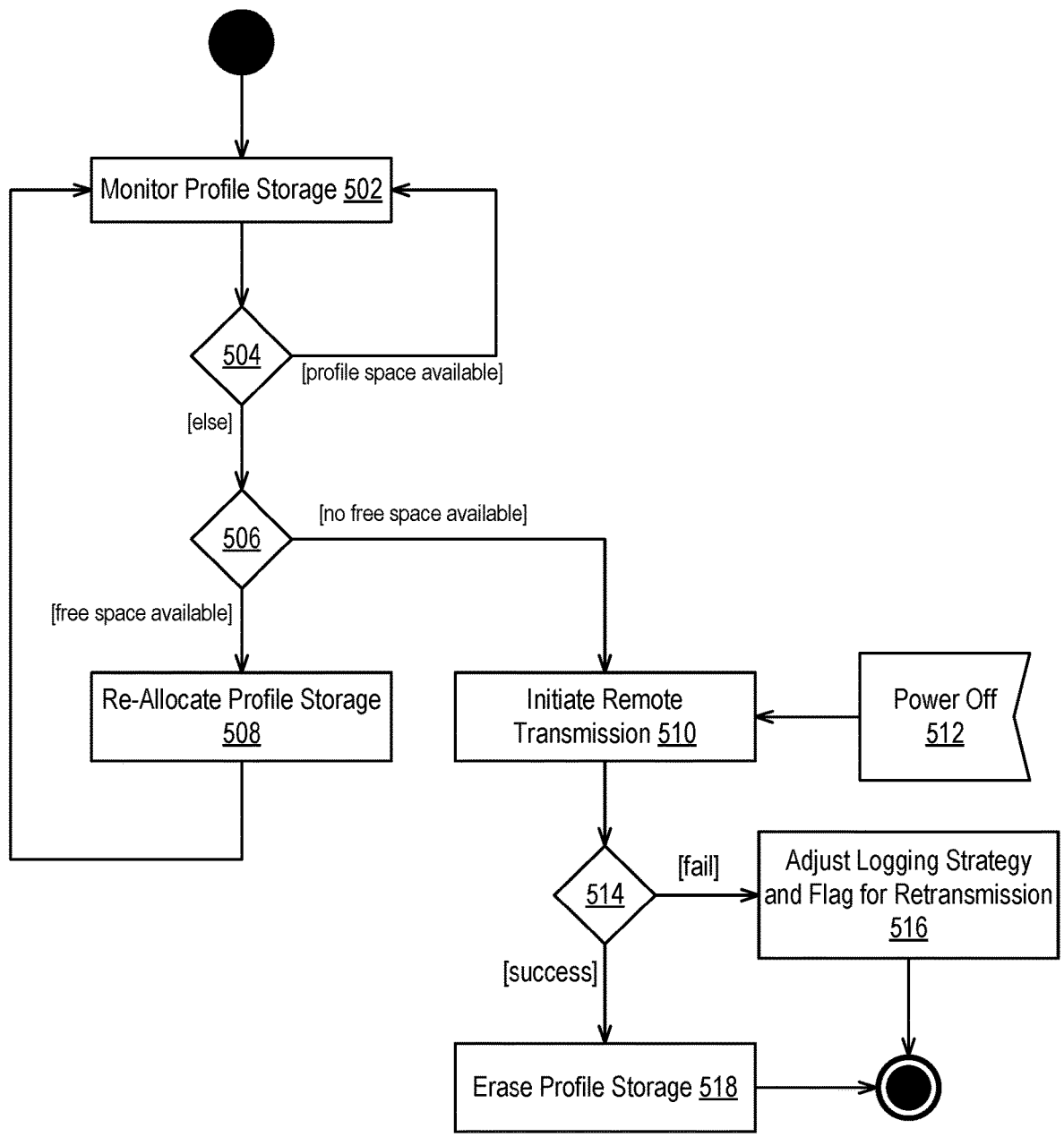
FIG. 5 is a flow diagram illustrating a method for managing the storage of a profile of a memory device according to some embodiments of the disclosure.

FIG. 5 is a flow diagram illustrating a method for managing the storage of a profile of a memory device according to some embodiments of the disclosure. In the illustrated embodiment, the method may be executed locally by a memory device and, in some embodiments, a controller of a memory device.

In block 502, the method monitors a profile storage location. In one embodiment, the method may periodically inspect the used capacity of the profile storage location. In some embodiments, the method may monitor this as it logs data to the location using the methods of FIG. 4. In another embodiment, the method may periodically analyze the profile storage location independent of the logging operations. In both scenarios, the method determines the amount of free storage space in the profile storage location.

In block 504, the method determines if space is available in the profile storage location. If so, the method continues to monitor the profile storage location in block 502. In one embodiment, the method determines if the calculated free storage space is greater than zero. If so, the method determines that space is available. Alternatively, the method can determine if the calculated free storage place is under a preconfigured threshold. If so, the method may proactively determine that not enough space is, or will be, available. In some embodiments, the method can further predict when storage space will be fully utilized. In these embodiments, the method may determine a rate at which the profile storage location is being filed and schedule execution of the method accordingly. In this embodiment, the method may alternatively be interrupt-driven and start at block 506, the interrupt corresponding to the predicted time in which the profile storage location will be filled.

In block 506, once the method determines that there is not enough available space in the profile storage location, the method determines whether any free space is available on the memory device. In this block, the method has determined that the allocated profile storage location is at or near capacity. Then, the method determines whether any free space is available on the memory device. As used herein, any free space refers to free storage locations other than the profile storage location.

If there is any free space available on the memory device in block 506, the method proceeds to block 508. Alternatively, if the method determines that there is no free space available on the memory device in block 506, the method proceeds to block 510. In some embodiments, the method may also determine, in block 506, if the profile storage has reached a maximum capacity that is pre-set in the memory device. In this scenario, the method proceeds to block 510 immediately if the pre-set maximum capacity is reached.

In block 508, the method re-allocates the profile storage based on the available free space. In this block, the method attempts to re-allocate free space for profile storage to support adding more log data. In some embodiments, the method may set a maximum profile storage size to prevent the profile storage from using all free space on the memory device. In some embodiments, the method will identify a larger, contiguous address space and initiate copying of the current profile storage address space to the new address space. In other embodiments, the method may only allocate a delta space (the needed extra capacity) and update a write pointer to write to the delta space for future data. In this embodiment, the profile storage may be fragmented, and the method must maintain a listing of fragments to enable a complete reading of the profile storage, as discussed previously.

In block 510, the method initiates a remote transmission of profile data. In the illustrated embodiment, block 510 may also be executed in response to detecting that the memory device is about to be powered off, as illustrated by interrupt signal 512. As discussed above, when the memory device is about to be powered off, it may receive a signal indicating as such. In the illustrated embodiment, the method pauses the powering off to initiate (or schedule) a remote transmission. In the illustrated embodiment, the method may initiate a remote transmission directly from a memory device. In these embodiments, the method generates the transmission and communicates with an external or internal network interface to communicate with a remote server. In other embodiments, the method may generate the transmission and forward the transmission to a host processor for network transmission.

In one embodiment, the content of the transmission comprises the data in the profile storage location. In some embodiments, the method transmits all contents of the profile storage location. In other embodiments, the method transmits a portion of the contents of the profile storage location. In some embodiments, the method may chunk the contents and generate multiple transmissions for each chunk.

In some embodiments, the method transmits the contents of the profile storage location in a raw format. In other embodiments, the method may compress or otherwise reduce the size of the raw data for transmission. For example, the method may use GZip compression to reduce the file size. In some embodiments, the method may also perform preprocessing on the raw data to reduce its size. For example, the method may perform grouping or aggregation operations to minimize the data size.

In some embodiments, the method may include a unique identifier associated with the memory device in each transmission. In these embodiments, the method may also digitally sign the transmission using a private key of the memory device. As will be discussed, the endpoint receiving the network transmission may store a mapping of public keys to unique identifiers and may use these public keys to validate the transmissions.

In block 514, the method determines if the network transmission is successful. In some embodiments, the network protocol used may return acknowledgments of receipt of data. In some embodiments, the method initiates a network-based transmission using a protocol such as transmission control protocol (TCP) or similar protocols. Thus, in this block, the method confirms that the network transmission was received by the recipient.

In block 516, if the network transmission is not successful, the method adjusts the logging strategy and flags the profile for retransmission. The method may perform either operation or both, depending on the implementation.

In the illustrated embodiment, adjusting a logging strategy in response to an unsuccessful comprises changing the amount of logging performed by the memory device. In one embodiment, the method may halt all logging. In another embodiment, the method may downsample the fidelity of the logging (e.g., only logging errors and not read/write operations). In some embodiments, the method may employ a strategy to balance comprehensive logging with reduced storage space while the method awaits a successful transmission.

In the illustrated embodiment, flagging the profile for retransmission may comprise locking the data that was attempted to be transmitted. In one embodiment, the method may rewrite the transmission data to the profile storage location, removing the raw data in its place. In this manner, if the method compresses the data, it can reclaim the excess storage space while still maintaining the processed data for retransmission. In some embodiments, the method may periodically attempt retransmissions until succeeding. In other embodiments, the method may await a signal from the host processor or network interface that the network is available.

In block 518, if the network transmission was successful, the method erases the profile storage location containing data transmitted to the remote computing device. In one embodiment, the method erases the raw data in the profile storage location that corresponds to the network transmission. In other embodiments, the method may have previously erased the raw data and written the compressed or otherwise processed data. In these embodiments, the method erases the processed data from the profile storage location. In either event, the method reclaims the space previously occupied by the uploaded data.

Figure 6:
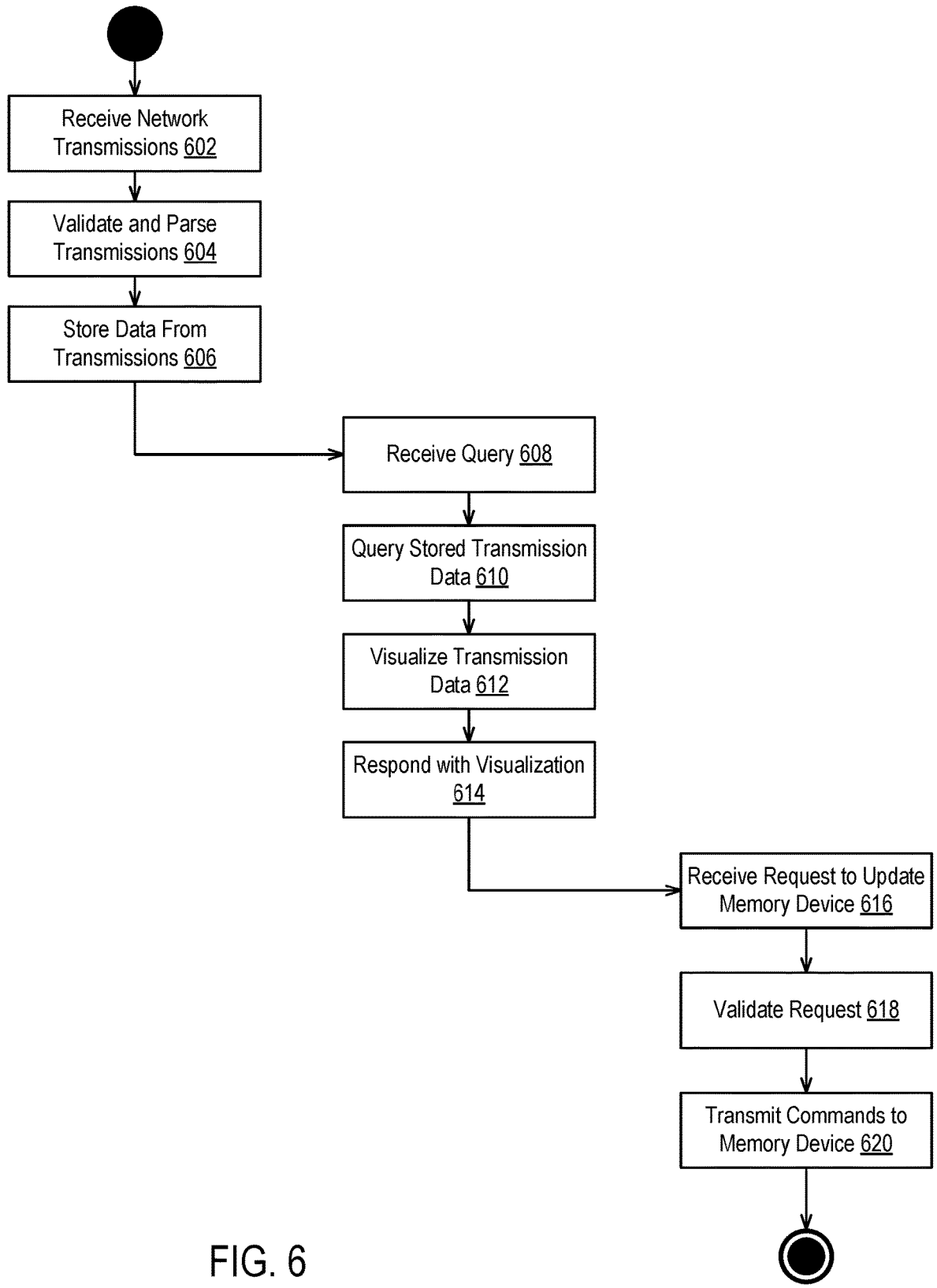
FIG. 6 is a flow diagram illustrating a method for aggregating memory device profiles and updating operating parameters of memory devices according to some embodiments of the disclosure.

FIG. 6 is a flow diagram illustrating a method for aggregating memory device profiles and updating operating parameters of memory devices according to some embodiments of the disclosure. In the illustrated embodiment, the method may be executed locally by a remote computing device. In the illustrated embodiment, the method of FIG. 6 may be triggered by a remote network transmission such as that initiated in block 510 of FIG. 5.

In block 602, the method receives network transmissions from memory devices. As discussed, these network transmissions may be received from memory devices, with or without assistance by a host processor. In some embodiments, the network transmissions may comprise TCP transmissions or higher-level protocol transmissions.

In block 604, the method validates and parses the network transmissions. In one embodiment, the network transmissions include digital signatures and unique identifiers. In one embodiment, the method extracts the unique identifier and loads a public key associated with the unique identifier. In one embodiment, the method maintains a database mapping unique identifiers to public keys and loads the public key from this database. In other embodiments, the method may retrieve the public key from a certificate authority (CA) or other trusted party. In one embodiment, the method validates the network transmission by extracting a digital signature from the network transmission and decrypting the digital signature using the public key, the decrypting resulting in a transmission hash (i.e., a hash of the transmitted data). The method then performs its own hashing of the data and compares the result to the hash generated by decrypting the digital signature. If the hashes match, the method validates the network transmission and can safely associate the transmission with the unique identifier (i.e., the transmitting memory device). Further, in some embodiments, the method may store a mapping of unique identifiers to organizations. Thus, by proxy, the method can associate a network transmission to both a memory device and an organization.

In addition to validating the transmission, the method may parse the transmission. In some embodiments, parsing the transmission may include decompressing the data. Alternatively, or in conjunction with the foregoing, the parsing may include decrypting the data. Alternatively, or in conjunction with the foregoing, the parsing may include expanding the data. In some embodiments, the method may augment the data with additional data such as tags, organizational-defined data, and generally any other type of static or semi-static data. In some embodiments, this augmented data may comprise positional data. For example, the operator of the memory device may record GPS data for a computing device, including the memory device. This data may be timestamped independently of the logging operations described herein. Thus, the method may use a second data stream and combine the second data stream with the log data to augment the logging data. Thus, the data points in FIG. 2A can be augmented with real-time GPS data based on the organization's use of the memory device.

In block 606, the method stores data from the network transmissions. In some embodiments, the method may store the data in a relational database cluster or similar database. Alternatively, or in conjunction with the foregoing, the method may write the data to a data lake, data warehouse, or other big data storage platform.

In the illustrated embodiment, blocks 602, 604, 606 comprise a receipt subroutine.

In block 608, the method receives a query. In one embodiment, the method receives a query via an application. In one embodiment, the application comprises a web page transmitted to a client. Alternatively, or in conjunction with the foregoing, the application may comprise a desktop application. Alternatively, or in conjunction with the foregoing, the application may comprise a mobile application. In all scenarios, the application may authenticate a user or organization and allow users to request data via the query. In one embodiment, the query may be embedded in a network request and thus may comprise a network request (e.g., a Hypertext Transfer Protocol, HTTP, request). In one embodiment, the query includes various parameters used by the server to locate data received from memory devices. For example, the query may include a time range, a list of memory device unique identifiers, fields to retrieve, etc.

In block 610, the method queries stored transmission data. In one embodiment, the transmission data is stored in a database as described previously. In the illustrated embodiment, the method uses the query parameters to generate a suitable query for the underlying data storage device and issues the query to the data storage device. In response, the method receives the data from the data storage device.

In block 612, the method visualizes the transmission data returned in response to the query. In this block, the method parses the returned data. In one embodiment, the method filters the data based on the query. For example, the returned data may comprise full-featured data, including fields not responsive to the query. The method may remove these fields prior to visualizing. Additionally, the method may group or aggregate data based on the constraints of the visualization. Next, the method generates a graphical visualization of the data. In some embodiments, this visualization may comprise an image or other static visualization. In other embodiments, the method may return the data used to generate the visualization, and the client may generate the visualization using a client-side library (e.g., D3.js or similar libraries).

In block 614, the method responds with the visualization. In the illustrated embodiment, the method responds to the original network request containing the query, thus completing the transmission of the visualization in response to the query. Depending on the application, the response may comprise a marshaled response (e.g., a Javascript Object Notation, JSON, response) or a web page (or both).

In the illustrated embodiment, blocks 608, 610, 612, and 614 comprise a visualization subroutine.

In block 616, the method receives a request to update a memory device. In the illustrated embodiment, the application may provide an interface allowing a user to update one or more memory devices. For example, when displaying the visualization, the application may provide buttons or other user interface (UI) elements allowing one-click changes to the memory devices depicted in the visualization. Other UI elements may be used, such as sliders, text/numeric inputs, etc. Similar to the preceding transmissions, the method may receive a network request that references one or more memory devices and includes the desired action to perform on the memory device. For example, the action may indicate that the clock speed of the memory device should be reduced for a time period after powering on. The specific actions undertaken by the memory device are not intended to be limiting.

In block 618, the method validates the request. In one embodiment, the method confirms that all of the memory device identifiers are associated with the account of the user issuing the query. In some embodiments, an organization is associated with one or more users. Thus, a user issuing a query can be used to identify a corresponding organization. Then, as discussed, the method can confirm that each memory device identifier is associated with that organization. Thus, the method in block 618 ensures that users cannot update arbitrary memory devices. Further, in some embodiments, the method can utilize a role-based permissions system to confirm that the user has the authority to perform the requested update. For example, users may be classified as "view only" and thus unable to perform updates to memory devices.

In block 620, the method generates and transmits commands to a memory device. In one embodiment, the method generates device-specific commands and transmits these commands to each memory device.

In one embodiment, each memory device is assigned a network address for receiving data. In this embodiment, the method may issue commands directly to memory devices. In other embodiments, the method may generate the commands and transmit the commands to another computing device. This other computing device may be responsible for managing the network addresses of memory devices and may forward the commands to the memory devices. For example, a server managing autonomous vehicles may receive the commands and issue the commands to each autonomous vehicle based on its management of the fleet. In another embodiment, an organization that provides cloud-based IoT services for IoT devices may receive the commands and issue the commands (similar to an "update") to all connected IoT devices.

In some embodiments, the commands may take the form of microcode or firmware updates to be installed on memory devices. Thus, in some embodiments, the updates to the memory devices can be installed as such, using any existing firmware/microcode update techniques.

In the illustrated embodiment, blocks 616, 618, and 620 comprise a remote update subroutine.

Figure 7:
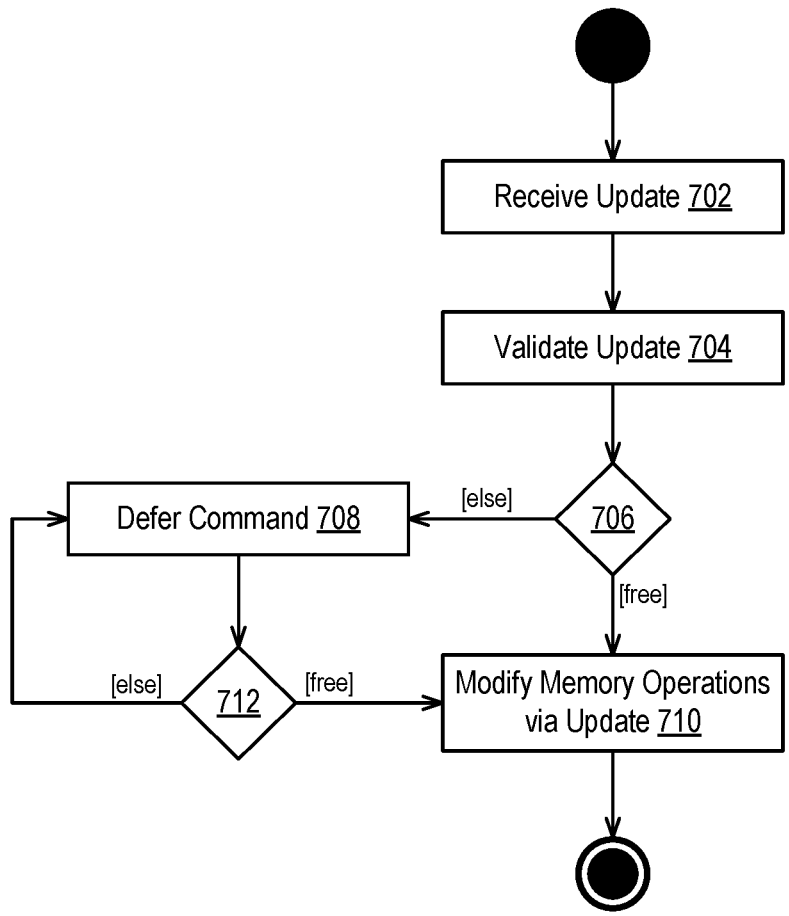
FIG. 7 is a flow diagram illustrating a method for updating the operating parameters of a memory device according to some embodiments of the disclosure.

FIG. 7 is a flow diagram illustrating a method for updating the operating parameters of a memory device according to some embodiments of the disclosure. In the illustrated embodiment, the method may be executed locally by a memory device and, in some embodiments, a controller of a memory device.

In block 702, the method receives an update from a remote computing device, the update including instructions to modify the operations of the memory device controller. In one embodiment, the update comprises a series of commands for the memory device to execute to update its settings. In another embodiment, the update comprises a microcode or firmware update. In one embodiment, the method may receive the update directly from the remote computing device via a network interface. In other embodiments, the method may receive the update from a host processor over an internal memory bus.

In block 704, the method validates the update. In one embodiment, the update may be digitally signed using the private key of the remote computing device. In one embodiment, the method uses a pre-stored public key corresponding to the private key to validate the digital signature, similar to the process described in block 604. In one embodiment, the update may further be signed by a private key used by the host processor, and the memory device may perform a second validation of the digital signature generated using that private key.

In block 706, the method determines if the memory device is free to apply the update. In one embodiment, the method applies an update when not servicing commands. In one embodiment, the method may time the update to be applied during a garbage collection cycle or similar maintenance interval. In this manner, the update can be applied as quickly as possible.

In block 708, if the method determines that the memory device cannot apply the command, it defers the execution of the command. Next, the method continues to determine if the memory device is free (block 710) and defers the command (block 708) until the memory device is free (block 710). Once the memory device is free, the method proceeds to block 712.

In block 712, the method modifies the operations of the memory device based on the received update. As discussed above, in some embodiments, the method may patch or replace the microcode or firmware of the controller based on the update. In other embodiments, the method may update a configuration setting or multiple such settings in response to the update.

FIG. 8 is a block diagram illustrating a memory system according to some embodiments of the disclosure.

As illustrated in FIG. 8, a computing system (800) includes a host processor (802) communicatively coupled to a memory system (804) via a bus (818). The memory system (804) comprises a controller (806) communicatively coupled to one or more memory banks (814A-814N), forming a memory array via a bus/interface (816). As illustrated, the controller (806) includes a local cache (808), firmware (810), and an error correction code (ECC) module (812).

In the illustrated embodiment, a host processor (802) can comprise any type of computer processor, e.g., a central processing unit (CPU), graphics processing unit (GPU), or other types of general-purpose or special-purpose computing devices. The host processor (802) includes one or more output ports that allow for the transmission of address, user, and control data between the host processor (802) and the memory system (804). In the illustrated embodiment, this communication is performed over the bus (818). In one embodiment, the bus (818) comprises an input/output (I/O) bus or a similar type of bus.

The memory system (804) is responsible for managing one or more memory banks (814A-814N). In one embodiment, the banks (814A-814N) comprise NAND Flash dies or other configurations of non-volatile memory. In one embodiment, the memory banks (814A-814N) comprise a memory array.

The banks (814A-814N) are managed by the controller (806). In some embodiments, the controller (806) comprises a computing device configured to mediate access to and from banks (814A-814N). In one embodiment, the controller (806) comprises an ASIC or other circuitry installed on a printed circuit board housing the banks (814A-814N). In some embodiments, the controller (806) may be physically separate from the banks (814A-814N). The controller (806) communicates with the banks (814A-814N) over the interface (816). In some embodiments, this interface (812) comprises a physically wired (e.g., traced) interface. In other embodiments, the interface (812) comprises a standard bus for communicating with banks (814A-814N).

The controller (806) comprises various modules (808-812). In one embodiment, the various modules (808-812) comprise various physically distinct modules or circuits. In other embodiments, the modules (808-812) may completely (or partially) be implemented in software or firmware.

As illustrated, firmware (810) comprises the core of the controller and manages all operations of the controller (806). The firmware (810) may implement some or all of the methods described above. Specifically, the firmware (810) may implement the methods described in FIGS. 4 through 7.

Figure 9:
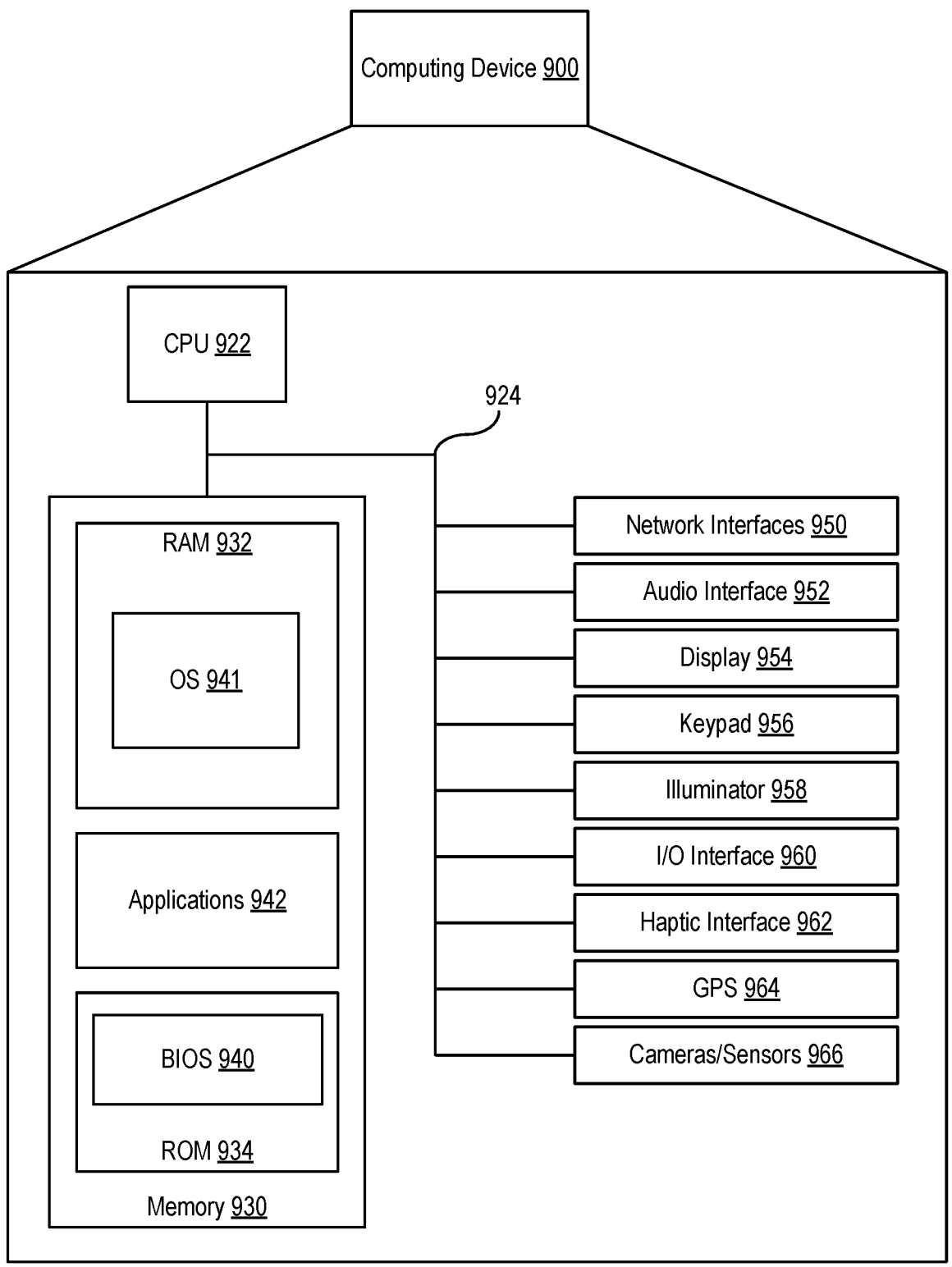
FIG. 9 is a block diagram illustrating a computing device showing an example of a client or server device used in the various embodiments of the disclosure.

FIG. 9 is a block diagram illustrating a computing device showing an example of a client or server device used in the various embodiments of the disclosure.

The computing device (900) can include more or fewer components than those shown in FIG. 9, depending on the deployment or usage of the device (900). For example, a server computing device, such as a rack-mounted server, may not include audio interfaces (952), displays (954), keypads (956), illuminators (958), haptic interfaces (962), Global Positioning Service (GPS) receivers (964), or cameras/sensors (966). Some devices can include additional components not shown, such as graphics processing unit (GPU) devices, cryptographic co-processors, artificial intelligence (AI) accelerators, or other peripheral devices.

As shown in the figure, the device (900) includes a central processing unit (CPU) (922) in communication with a mass memory (930) via a bus (924). The computing device (900) also includes one or more network interfaces (950), an audio interface (952), a display (954), a keypad (956), an illuminator (958), an input/output interface (960), a haptic interface (962), an optional global positioning systems (GPS) receiver (964) and a camera(s) or other optical, thermal, or electromagnetic sensors (966). Device (900) can include one camera/sensor (966) or a plurality of cameras/sensors (966). The positioning of the camera(s)/sensor(s) (966) on the device (900) can change per device (900) model, per device (900) capabilities, and the like, or some combination thereof.

In some embodiments, the CPU (922) can comprise a general-purpose CPU. The CPU (922) can comprise a single-core or multiple-core CPU. The CPU (922) can comprise a system-on-a-chip (SoC) or a similar embedded system. In some embodiments, a GPU can be used in place of, or in combination with, a CPU (922). Mass memory (930) can comprise a dynamic random-access memory (DRAM) device, a static random-access memory device (SRAM), or a Flash (e.g., NAND Flash) memory device. In some embodiments, mass memory (930) can comprise a combination of such memory types. In one embodiment, the bus (924) can comprise a Peripheral Component Interconnect Express (PCIe) bus. In some embodiments, the bus (924) can comprise multiple busses instead of a single bus.

Mass memory (930) illustrates another example of computer storage media for the storage of information such as computer-readable instructions, data structures, program modules, or other data. Mass memory (930) stores a basic input/output system ("BIOS") (940) for controlling the low-level operation of the computing device (900). In the illustrated embodiment, the BIOS (940) may be stored in a read-only memory (ROM) such as ROM (934). The mass memory also stores an operating system (941) for controlling the operation of the computing device (900)

Applications (942) can include computer-executable instructions which, when executed by the computing device (900), perform any of the methods (or portions of the methods) described previously in the description of the preceding Figures. In some embodiments, the software or programs implementing the method embodiments can be read from a hard disk drive (not illustrated) and temporarily stored in RAM (932) by CPU (922). CPU (922) can then read the software or data from RAM (932), process them, and store them in RAM (932) again.

The computing device (900) can optionally communicate with a base station (not shown) or directly with another computing device. Network interface (950) is sometimes known as a transceiver, transceiving device, or network interface card (NIC).

The audio interface (952) produces and receives audio signals such as the sound of a human voice. For example, the audio interface (952) can be coupled to a speaker and microphone (not shown) to enable telecommunication with others or generate an audio acknowledgment for some action. Display (954) can be a liquid crystal display (LCD), gas plasma, light-emitting diode (LED), or any other type of display used with a computing device. Display (954) can also include a touch-sensitive screen arranged to receive input from an object such as a stylus or a digit from a human hand.

Keypad (956) can comprise any input device arranged to receive input from a user. Illuminator (958) can provide a status indication or provide light.

The computing device (900) also comprises an input/output interface (960) for communicating with external devices, using communication technologies, such as USB, infrared, Bluetooth®, or the like. The haptic interface (962) provides tactile feedback to a user of the client device.

The optional GPS receiver (964) can determine the physical coordinates of the computing device (900) on the surface of the Earth, which typically outputs a location as latitude and longitude values. GPS receiver (964) can also employ other geo-positioning mechanisms, including, but not limited to, triangulation, assisted GPS (AGPS), E-OTD, CI, SAI, ETA, BSS, or the like, to further determine the physical location of the computing device (900) on the surface of the Earth. In one embodiment, however, the computing device (900) can communicate through other components, provide other information that can be employed to determine the physical location of the device, including, for example, a MAC address, IP address, or the like.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to the desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product or software that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as read-only memory ("ROM"), random access memory ("RAM"), magnetic disk storage media, optical storage media, flash memory components, etc.

In this description, various functions and operations are described as being performed by or caused by computer instructions to simplify the description. However, those skilled in the art will recognize what is meant by such expressions is that the functions result from the execution of the computer instructions by one or more controllers or processors, such as a microprocessor. Alternatively, or in combination, the functions and operations can be implemented using special-purpose circuitry, with or without software instructions, such as using Application-Specific Integrated Circuit (ASIC) or Field-Programmable Gate Array (FPGA). Embodiments can be implemented using hardwired circuitry without software instructions or in combination with software instructions. Thus, the techniques are limited neither to any specific combination of hardware circuitry and software nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    monitoring, by a memory device, die temperatures and data sizes of commands issued to the memory device during a first period of time, the die temperatures and the data sizes correlated via timestamps;
    storing, by the memory device, the die temperatures and the data sizes in a log file;
    determining, by the memory device, a target size for a buffer based on a current temperature by:
        identifying similar historical temperatures present in the log file,
        extracting a plurality of data sizes from the log file that are correlated with the similar historical temperatures, the plurality of data sizes corresponding to a plurality of read or write commands issued during the similar historical temperatures, and aggregating the plurality of data sizes to determine the target size; and adjusting, by the memory device, a current size of the buffer to meet the target size.

2. The method of claim 1, wherein monitoring the die temperatures comprises reading the die temperatures from a temperature sensor, generating the timestamps for the die temperatures, and writing the die temperatures and the timestamps to the log file.

3. The method of claim 1, wherein monitoring the data sizes of commands issued to the memory device comprises calculating a data size of data required to execute the commands.

4. The method of claim 3, the commands comprising read and write commands.

5. The method of claim 1, further comprising determining that the current temperature is below a target operating temperature prior to determining the target size for the buffer.

6. The method of claim 1, further comprising uploading the die temperatures and the data sizes to a remote computing device.

7. The method of claim 6, wherein determining the target size comprises receiving the target size from the remote computing device.

8. The method of claim 1, wherein determining the target size comprises identifying historical data sizes recorded at historical temperatures, the historical temperatures within a preset deviation from the current temperature.

9. A non-transitory computer-readable storage medium for tangibly storing computer program instructions capable of being executed by a computer processor, the computer program instructions defining steps of:

monitoring die temperatures and data sizes of commands issued to a memory device, the die temperatures and the data sizes correlated via timestamps;

storing the die temperatures and the data sizes in a log file;

determining a target size for a buffer based on a current temperature by:

identifying similar historical temperatures present in the log file, extracting a plurality of data sizes from the log file that are correlated with the similar historical temperatures, the plurality of data sizes corresponding to a plurality of read or write commands issued during the similar historical temperatures, and aggregating the plurality of data sizes to determine the target size; and adjusting a current size of the buffer to meet the target size.

10. The non-transitory computer-readable storage medium of claim 9, wherein monitoring the die temperatures comprises reading the die temperatures from a temperature sensor, generating the timestamps for the die temperatures, and writing the die temperatures and the timestamps to the log file.

11. The non-transitory computer-readable storage medium of claim 9, wherein monitoring the data sizes of commands issued to the memory device comprises calculating a data size of data required to execute the commands.

12. The non-transitory computer-readable storage medium of claim 11, the commands comprising read and write commands.

13. The non-transitory computer-readable storage medium of claim 9, the computer program instructions further defining a step of determining that the current temperature is below a target operating temperature prior to determining the target size for the buffer.

14. The non-transitory computer-readable storage medium of claim 9, the computer program instructions further defining a step of uploading the die temperatures and the data sizes to a remote computing device.

15. The non-transitory computer-readable storage medium of claim 14, wherein determining the target size comprises receiving the target size from the remote computing device.

16. A memory device comprising:

a storage array; and a controller configured to:

monitor die temperatures and data sizes of commands issued to the memory device, the commands accessing the storage array, the die temperatures and the data sizes correlated via timestamps;

store the die temperatures and the data sizes in a log file;

determine a target size for a buffer based on a current temperature by:

identifying similar historical temperatures present in the log file, extracting a plurality of data sizes from the log file that are correlated with the similar historical temperatures, the plurality of data sizes corresponding to a plurality of read or write commands issued during the similar historical temperatures, and aggregating the plurality of data sizes to determine the target size; and adjust a current size of the buffer to meet the target size.

17. The memory device of claim 16, wherein monitoring the die temperatures comprises reading the die temperatures from a temperature sensor, generating the timestamps for the die temperatures, and writing the die temperatures and the timestamps to the log file.

18. The memory device of claim 16, the controller further configured to determine that the current temperature is below a target operating temperature prior to determining the target size for the buffer.

19. The memory device of claim 16, the controller further configured to:

upload the die temperatures and the data sizes to a remote computing device, and wherein determining the target size comprises receiving the target size from the remote computing device.

* * * * *